United States Patent
Gung

(10) Patent No.: US 7,686,928 B2
(45) Date of Patent: Mar. 30, 2010

(54) PRESSURE SWITCHED DUAL MAGNETRON

(75) Inventor: Tza-Jing Gung, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 1082 days.

(21) Appl. No.: 10/949,829

(22) Filed: Sep. 23, 2004

(65) Prior Publication Data

US 2006/0060470 A1    Mar. 23, 2006

(51) Int. Cl.
  C25B 9/00   (2006.01)
  C23C 14/00  (2006.01)
  C25B 11/00  (2006.01)
  C25B 13/00  (2006.01)

(52) U.S. Cl. ............ 204/298.2; 204/298.16; 204/298.17; 204/298.19; 204/298.21; 204/298.22

(58) Field of Classification Search ............ 204/192.12, 204/192.15, 192.17, 298.07, 298.16, 298.17, 204/298.18, 298.19, 298.2, 298.21, 298.22; 438/685

See application file for complete search history.

(56) References Cited

U.S. PATENT DOCUMENTS

| | | | |
|---|---|---|---|
| 5,593,551 A * | 1/1997 | Lai ........................ | 204/192.12 |
| 5,919,345 A * | 7/1999 | Tepman .................... | 204/298.2 |
| 6,156,170 A * | 12/2000 | Akari et al. ............. | 204/298.18 |
| 6,228,235 B1 * | 5/2001 | Tepman et al. ........... | 204/298.2 |
| 6,228,236 B1 | 5/2001 | Rosenstein et al. ....... | 204/298.2 |
| 6,296,747 B1 * | 10/2001 | Tanaka ................... | 204/298.07 |
| 6,409,890 B1 * | 6/2002 | Grunes et al. .......... | 204/192.12 |
| 6,451,177 B1 | 9/2002 | Gopalraja et al. ...... | 204/192.12 |
| 6,462,482 B1 * | 10/2002 | Wickramanayaka et al. ..... 315/111.21 |
| 6,495,009 B1 * | 12/2002 | Gung ...................... | 204/298.2 |
| 6,709,553 B2 * | 3/2004 | Wang et al. ............. | 204/192.3 |
| 2001/0030123 A1 * | 10/2001 | Fu et al. ................ | 204/192.15 |
| 2002/0175074 A1 * | 11/2002 | Gung .................... | 204/298.19 |
| 2003/0015421 A1 * | 1/2003 | Cha et al. ............. | 204/298.19 |
| 2003/0052001 A1 * | 3/2003 | Park et al. ............. | 204/298.19 |
| 2003/0116427 A1 * | 6/2003 | Ding et al. ............. | 204/192.17 |
| 2004/0112735 A1 * | 6/2004 | Saigal et al. ........... | 204/192.12 |
| 2005/0048775 A1 * | 3/2005 | Donohue .................... | 438/685 |
| 2005/0199485 A1 * | 9/2005 | Kadlec et al. .......... | 204/192.12 |

* cited by examiner

Primary Examiner—Jennifer K Michener
Assistant Examiner—Michael Band
(74) Attorney, Agent, or Firm—Law Offices of Charles Guenzer

(57) ABSTRACT

A dual magnetron for plasma sputtering in which two distinctly different magnetrons are mounted on a common plate rotating about a central axis in back of a target. At least one of the magnetrons is switched on and off by changes in chamber pressure or target power while the other magnetron, if it does switch, switches in complementary fashion. When the two magnetrons are mounted at different radii, the switching effects a effective movement of the magnetron such that different areas of the target are exposed to a sputtering plasma. In particular, a small unbalanced magnetron may scan the target edge to produce a highly ionized sputter flux and a larger magnetron positioned near the center can be switched on to clean sputter material redeposited on the target center.

16 Claims, 3 Drawing Sheets

PRESSURE SWITCHED DUAL MAGNETRON

FIELD OF THE INVENTION

The invention relates generally to sputtering of materials. In particular, the invention relates to the magnetron creating a magnetic field to enhance sputtering.

BACKGROUND ART

Sputtering, alternatively called physical vapor deposition (PVD), is the most prevalent method of depositing layers of metals and related materials in the fabrication of integrated circuits. Its most commercially important implementations include a magnetron positioned in back of the target being sputtered. As originally developed for the semiconductor industry, sputtering deposits aluminum and other conductive materials onto the surface of silicon wafers, in the surface of which there may be formed holes or other features having relatively mild aspect ratios. Many of the magnetron sputter reactors developed for this use and still being used include a magnetron having inner and outer poles of equal intensity in a nested structure having a substantially constant annular gap between the poles with an encompassing size of the magnetron that is only somewhat smaller than the target being sputtered. The magnetron is nonetheless rotated about the target center to scan and uniformly sputter the entire target. The primary design consideration in this design is uniform erosion of the target although some consideration is given to the fact that the uniform deposition on the wafer from a target only somewhat bigger than the wafer is not satisfied by uniform target erosion.

More recently, sputtering has been increasingly applied to deposit thin conformal layers into holes formed in dielectric and other layers having a high aspect ratio, that is, a large value of the ratio of the depth to the width of the hole. An example of a high-aspect ratio hole is via hole formed through a dielectric layer to provide a vertical interconnect. Such a hole may have a depth of 1 µm and a width of less than 100 nm. Another example is a narrow trench for a memory capacitor. It has been found that sputtering into such unfavorable geometries can be accomplished with a small but strong magnetron that is at least partially unbalanced, that is, its outer pole has a total magnetic intensity, which is the magnetic flux integrated over the outer pole, that is greater than the total magnetic intensity of the inner pole. The unbalance may vary around the annular gap between the two poles. Uniform erosion and deposition with such a small magnetron is achieved by rotating it about the target center, but the small magnetron in this design approach should still extend towards the target center.

Sidewall coverage is typically the most crucial aspect of sputtering thin conformal layers into high aspect-ratio holes. The sidewall thickness must be sufficient to provide the required barrier or seed function but not so thick as to block the hole. Further, the sidewall coverage must be fairly uniform along the sidewall height since any point having insufficient thickness, particularly for a barrier layer, introduces a defect in the entire chip. As a result, deposition uniformity over the radius of the wafer is not considered as the most crucial issue. Instead, sidewall uniformity and sidewall asymmetry between the radially inner and outer sidewalls have become the crucial issues.

It has been found that sidewall asymmetry is reduced when a small magnetron preferentially and perhaps solely sputters the periphery or edge of the target and does not sputter the central portion of the target. Further, a large number of the sputtered atoms are ionized, and strong wafer biasing draws the ions into the holes at near vertical angles. Such edge sputtering, however, introduces a further problem. Sputter deposition involves transporting material sputtered from a target to the wafer. The transport may involve some scattering from the sputtering gas or other residual particles such that some of the sputtered atoms are redeposited on the target. Also, ionized sputtered atoms may be attracted back to another area of the target. Sputtered material redeposited in an area of the target being substantially sputtered presents little problem since it is immediately resputtered. That is, even with redeposition, on net the target is being sputtered and eroded in that area. However, if the sputtered material is redeposited in an area of the target not being substantially sputtered, for example, the target center during edge sputtering, the redeposited material at the center on net is not resputtered but instead contributes to a growing thickness of the redeposited material on the target. Redeposited target material does not bind well with the original target material, particularly when its thickness grows to tens or hundreds of microns. The problem is intensified when reactive sputtering is being used to deposit a reacted layer, for example, the barrier material tantalum nitride by sputtering tantalum in the presence of nitrogen within the sputtering chamber. Thicker nitride layers when redeposited on the metal target do not stick well to it. In any case, the redeposited material is likely to flake from the target and introduce severe particulate problems when the flaking material falls on the wafer.

Redeposition, whether on the edge or at the center, can be circumvented by a careful design of the magnetron to assure that there positive sputtering occurs in all areas of the target, that is, redeposition occurs nowhere. However, this requirement reduces the design freedom for optimizing other sputtering characteristics, such as ionization fraction and deposition profile and uniformity. It is, instead, preferred that the redeposition problem be resolved by means other than the magnetron used in sputter deposition.

Rosenstein et al. in U.S. Pat. No. 6,228,236 address a different but related problem in which the outer periphery of the target is being preferentially redeposited. Rosenstein proposes a centrifugal mechanism rotatably supporting a single magnetron to additionally move it from an inner position to an outer position dependent upon the direction of rotation of the magnetron. At the inner position, the target is being used as a sputter deposition source for depositing target material onto a wafer; at the outer position, the target is being sputtered and cleaned with no wafer present in the chamber. Hong et al. in provisional application 60/555,992, filed Mar. 24, 2004, more directly address redeposition at the target center in which another centrifugal mechanism moves a magnetron from the outer deposition position to an inner cleaning position dependent upon the speed of rotation. Other mechanisms have been suggested for mechanically moving a magnetron in the radial direction while it is also rotating with respect to a target center. These mechanical solutions are effective but are considered less than ideal because of the added expense of the mechanical mechanism required for the radial movement and the reliability issues always present with moving parts, particularly ones which are immersed in a cooling bath and which need to quickly move mechanical members between different modes of operation.

Accordingly, it is desired to clean unused portions of a target without use of mechanisms that radially move the magnetron.

Gopalraja et al. have disclosed in U.S. Pat. No. 6,451,177 bimodal plasma states in a target formed with an annular vault and the magnetron includes several different types of magnets at different portions of the vault primarily affecting the ionization fraction.

SUMMARY OF THE INVENTION

A magnetron assembly for use with plasma sputtering includes two disjunct magnetrons placed in back of the target and rotated about its center to enhance plasma sputtering of the target and in some cases to guide sputtered ions to the substrate being processed. The two magnetrons have different characteristics such that under two different sets of chamber conditions, such as pressure or target power, at least one of the magnetrons is switched between supporting a plasma adjacent a front face of the target and not supporting one. The other magnetron may remain unswitched or be switched in the opposite sense. The switching may be achieved by a change in chamber pressure of a sputter working gas such as argon, by a change in target, or a combination of the two.

When the two magnetrons are disposed at different radial positions, switching one or both of the magnetrons on and off causes an effective radial shift of the effective magnetron.

The invention is advantageously applied to a process for sputtering conformal layers in narrow holes in which the primary deposition sputters from the wafer edge, preferably producing a high ionization fraction of sputtered atoms and the secondary process cleans the center of the wafer of redeposited material. The edge magnetron may be small and located completely away from the target center while the center magnetron is large and when rotated generates a plasma over all central portion of the target including the target center.

The two magnetrons may produce significantly different magnetic fields, for example, weak vs. strong or balanced vs. unbalanced inner and outer poles. These differences may be used to effect different ionization fractions for the two magnetrons, whereby deposition profiles may be controlled according to which magnetron is switched on.

DETAILED DESCRIPTION OF THE PREFERRED EMBODIMENTS

Figure 1:
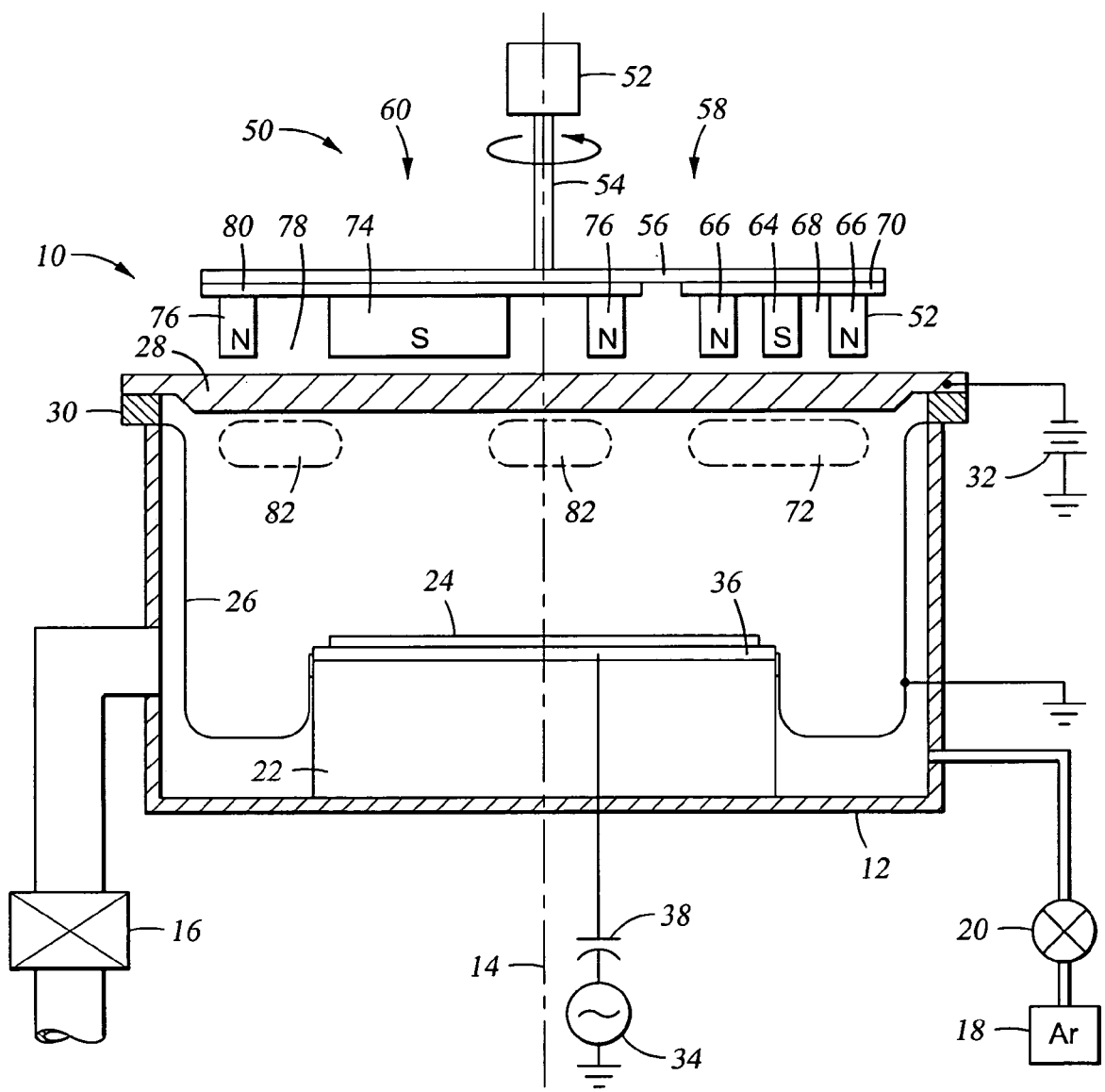
FIG. 1 is a schematic cross-sectional view of a sputter reactor incorporating one embodiment of dual magnetrons of the invention.

The invention allows a magnetron assembly to excite a plasma in different portions of the target adjacent to disjunct and substantially different magnetrons constituting the magnetron assembly. The different plasmas may be differentially excited dependent upon the chamber pressure and other processing conditions. The magnetron assembly may be easily incorporated into an otherwise conventional plasma sputter reactor 10 schematically illustrated in the cross-sectional view of FIG. 1. A vacuum chamber 12 for the reactor 10 is arranged generally symmetrically about a central axis 14. A vacuum pump system 16 pumps the vacuum chamber 12 to a base pressure in the microTorr range, but a gas supply 18 supplies argon as a sputter working gas into the chamber 12 through a mass flow controller 20. The argon pressure within the chamber 12 is maintained in the multi-milliTorr range for plasma ignition, but can thereafter be reduced to the sub-milliTorr range for many target materials with suitable chamber conditions and magnetrons since sputtered ions rather than argon ions can partially support a sputtering plasma in a self-ionizing plasma (SIP) process. The chamber pressure can even be reduced to effectively zero for copper targets since copper ions can fully support a plasma in a sustained self-sputtering (SSS) process.

A pedestal 22 within the chamber 12 supports a wafer 24 to be sputter coated. A grounded shield 26 protects the chamber 12 and the sides of the pedestal 22 from sputter deposition. A generally planar target 28 having at least a planar surface layer of the material to be sputtered, most typically a metal, is supported on and sealed to the chamber 12 through an isolator 30 and is disposed in opposition to the wafer 24 along the central axis 14. A DC power supply 32 electrically biases the target 28 negatively with respect to the grounded shield 26 to excite the argon working gas into a plasma. Although illustrated as a voltage supply, typically the DC power supply 32 is designed to supply a selectable level of power and its output voltage depends on the impedance of the plasma. The effect is most pronounced in igniting a plasma, which requires a relatively high voltage. After ignition, the plasma presents a significantly lower electrical impedance to the target cathode and the target voltage substantially falls to a level corresponding to the power level.

The positively charged argon ions are attracted to the target 28 with sufficient energy to dislodge or sputter atoms from the target 28, some of which strike the wafer 24 and deposit a layer of the target material onto the wafer 24. In a version of sputtering called reactive sputtering, a reactive gas such as nitrogen is additionally admitted into the chamber to react with the sputtered metal atoms to deposit a metal nitride layer on the wafer 24. In many applications involving sputtered atoms with a high ionization fraction, that is, sputtered ions, an RF power supply 34 biases a pedestal electrode 36 underlying the wafer 24 through a capacitive coupling circuit 38. In the presence of a plasma, the RF biased wafer 24 develops a negative DC self-bias, which accelerates the positively charged sputtered ions to the wafer 24, thereby converting the generally isotropic sputter distribution into a distribution strongly directed parallel to the central axis 14 and hence deep within high aspect-ratio holes such as vias in the wafer 24. Some tantalum sputter chambers include an RF coil of tantalum. In provisional application 60/574,905, Gung discloses an array of electromagnets behind the RF coil, thereby allowing use of the chamber in different modes.

A magnetron assembly 50 of the invention is positioned in back of the target 28 to project a magnetic field into the chamber 12 in front of the target 28 to increase the plasma density, thereby increasing the sputtering rate. A motor 52 drives a rotary shaft 54 extending along the central axis 14 at a rotation rate generally in the range of 40 to 100 rpm. Although not illustrated, the magnetic portions of the magnetron assembly 50 are typically enclosed in a cooling water bath at the back of the target 28, and the rotary drive shaft 54 penetrates into the bath through a rotary seal. A support plate 56 fixed to the end of the rotary shaft 54 supports a small, first magnetron 58 and a larger, second magnetron 60. As is better illustrated in the bottom plan view of FIG. 2, the two magnetrons 58, 60 in this embodiments are physically disjunct from each other along a diameter of the target 28 and are each generally symmetric about that diameter.

The small, first magnetron 58 in this embodiment is disposed completely away from the target center 14 and is intended for sputtering material from the edge of the target 28 onto the wafer 24. It is generally arc-shaped with an inner pole 64 having a first magnetic polarity along the central axis 14 surrounded by an outer pole 66 having an annular shape and an opposed second magnetic polarity and separated from the inner pole 64 by a nearly constant gap 68. The two poles 64, 66 are typically formed by separate magnetic pole pieces of the illustrated shapes underlaid by an array of cylindrical permanent magnets, usually of the same construction but of opposite orientations for the respective poles 64, 66. A magnetic yoke 70 at the back of the magnets magnetically couples the two poles 64, 66.

One purpose of the first magnetron 58 is to create a magnetic field parallel to the front face of the target which traps electrons and hence produces a first plasma region 72 of FIG. 1 over the area of the target 28 adjacent the rotating first magnetron 58. The plasma region 72 greatly increases the sputtering rate and also concentrates the target power in the area of the small, first magnetron 58. As a result of the plasma region 72 and the high target power density, a substantial fraction of the target atoms are ionized. The first magnetron 58 is preferably unbalanced in the meaning that the total magnetic intensity of the outer pole 66, that is, the magnetic flux integrated over the area of the outer pole 66, is substantially greater than the total magnetic intensity of the inner pole 64, for example, by a factor of at least two. The unbalanced first magnetron 58 thereby produces a magnetic field distribution having components which project towards the wafer 24, thereby guiding sputtered ions towards the wafer 24.

Figure 2:
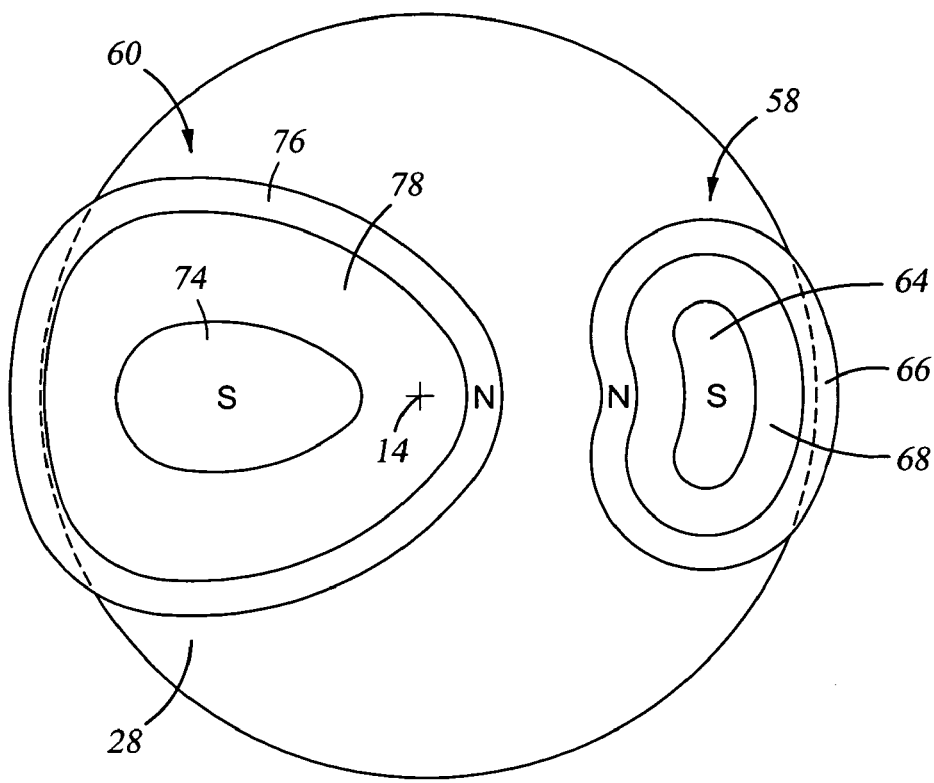
FIG. 2 is a bottom plan view of the dual magnetrons of FIG. 1.

The portion of the target 28 being sputtered at any time is primarily determined by plasma region 72, but rotation about the target center 14 produces an annular erosion band that is generally uniformly sputtered. For the nested first magnetron 58, the plasma region 72 is better described as a plasma loop that follows the shape of the gap 68 between the poles 64, 66. In the configuration of FIG. 2, the plasma loop associated with the small magnetron 58 sweeps over an annular band extending from beyond half the radius of the target to nearly the target edge and sputters target material from this band. The small magnetron 58 does not substantially sputter the portion of the target 28 within the half radius.

The second, larger magnetron 60, which in this embodiment of using the invention is intended for cleaning the target, similarly includes an inner pole 74 of the first magnetic polarity surrounded by an annular outer pole 76 of the second magnetic polarity and separated from the inner pole 74 by a nearly constant gap 78, which is significantly wider than the gap 68 for the small magnetron 58. The large magnetron 60, similarly to the small magnetron 58, has nested poles 74, 76 with the gap 78 between them defining a plasma loop, if a plasma is supported, in front of the target 78. The two poles 74, 76 may be formed by magnetic pole pieces of the illustrated shapes and include respective arrays of opposed permanent magnets, and a magnetic yoke 80 at their backs. However, other magnetron shapes are possible, including a conventional large magnetron having two closely spaced parallel bands of anti-parallel magnets and associated annular pole pieces. Separate magnetic yokes 70, 80 are not completely necessary if the two outer poles 66, 76 have the same magnetic polarity, in which case, a single magnetic support plate 56 can also function as the two magnetic yokes 70, 80. The primary purpose of the second magnetron 60 is to create a second, annular plasma region 82 to thereby increase the sputtering rate. The gap 78 and the annular plasma region extends from the edge of the target 28 over its center. Thereby, the rotating second magnetron 60 scans substantially the entire target 28 and sputters and cleans all of the target 28.

It is not necessary that the cleaning plasma band of the large magnetron 60 overlap the sputtering plasma band of the small magnetron 58 if there is no redeposition within the sputtering plasma band. However, if the two do overlap, the design of the small magnetron 58 is less constrained and may produce some limited areas of redeposition within its band. It is, however, preferred that the cleaning plasma band of the large magnetron 60 extend from the target center 14 at least to the sputtering plasma band of the small magnetron 58.

It is not crucial that the outer poles 66, 76 of the two magnetrons 58, 60 have the same polarity. However, matching polarities of the outer poles 66, 76 promote the functional disjunction and separation of the two magnetrons 58, 60 in addition to the physical separation of their poles. Although it is standard practice that the pole pieces have a shape conforming to and a size only slightly larger than the underlying magnets. However, particularly in the case of the two outer poles 66, 76 having the same polarity, the outer pole pieces 66, 76 may extend considerably beyond the illustrated shape and perhaps even be joined together with very little effect on either on either plasma loop. The magnetrons 58, 60 are disjunct if their plasma loops they produce are physically separated.

The dual magnetrons of FIGS. 1 and 2 are advantageously used in a two-step process in which in at least one of the steps one of the magnetrons does not support a plasma but in another step it does. Preferably, in a sputter deposition step, the small magnetron 58 sputters the edge of the target 28 while the larger magnetron 60 does not support a plasma and hence does not sputter the central area of the target; however, in a cleaning step, the larger magnetron 60 supports a plasma and hence sputters and cleans the entire target 28. It is not necessary to bias the wafer during the target cleaning, but it may be done for other purposes. It is possible during the cleaning step that the small magnetron 58 also supports a plasma. During both steps, the motor 52 rotates both magnetrons 58, 60 about the central axis 14.

Although target cleaning does not require that the second magnetron 60 be unbalanced so that both its poles 74, 76 may have the same total magnetic intensity, it may be advantageous to unbalance the second magnetron 60 with a stronger outer pole 76 of the same polarity as the outer pole 66 of the first magnetron 58. During the primary deposition using the small magnetron 58, even though the large magnetron 60 is not supporting a plasma, it does act as an auxiliary magnet for the small magnetron 60 reinforcing the projecting magnetic field in the middle of the chamber near the central axis 14. Auxiliary magnets and electromagnets are well known for guiding sputter ions, for example, by Wang in U.S. Pat. No. 6,352,629 and by Gung in U.S. Pat. No. 6,491,801.

The switching of the effective position of the magnetron may be controlled according to a recipe programmed into an unillustrated computerized controller by changing the chamber pressure or power applied to the target. No mechanical part, at least directly connected to the magnetron or within the vacuum chamber or the cooling bath in which the magnetron is immersed, is involved in the effective radial movement of the magnetron. The chamber pressure can be controlled by adjusting the vacuum pump system 16 or a butterfly valve in the line between it and the vacuum chamber 12 or by adjusting the mass flow controller 20 for the argon working gas. The target power or voltage is controlled through the DC power supply 32. As a result, switching between the two modes is accomplished by means already available in the conventional plasma reactor with the exception of the second, large magnetron.

Figure 3:
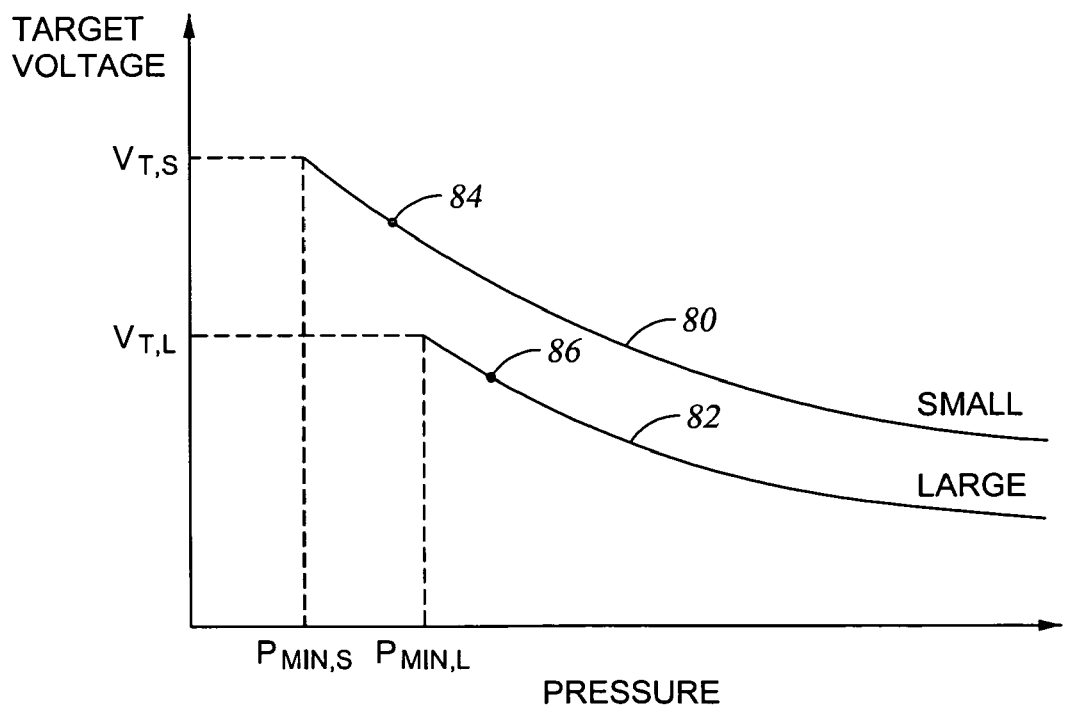
FIG. 3 is a graph of plasma states of two different magnetrons which may be switched according to one embodiment of the invention by a change in pressure.

Although the invention is not bound by its theory of operation, it is believed that two modes of operation can be understood by considering in the graph of FIG. 3 characteristic curves 80, 82 for the small and larger magnetrons 58, 60 respectively at a set target power. The curves 80, 82, which are similar to Paschen curves, are plotted as functions of chamber pressure and target voltage and represent the voltage at that pressure at which the respective magnetron supports a plasma after the plasma has been ignited. The separate curves 83, 84 assume the two magnetrons 58, 60 are operating independently of each other. A plasma is not supported in the operational regime below the respective curve while it is supported in the regime above. Furthermore, there are minimum pressures $P_{MIN,S}$ and $P_{MIN,L}$ for the small and large magnetron curves 80, 82 below which no amount of target power will support a plasma. The associated target voltages are $V_{T,S}$ and $V_{T,L}$. For some small magnetrons designed for sustained self-sputtering of copper, which can support a plasma with no argon working gas, $P_{MIN,S}$ is effectively zero. However, for the illustrated small arc-shaped magnetron 58, $P_{MIN,S}$ is about 0.4 milliTorr for a tantalum target while for the illustrated large magnetron 60, $P_{MIN,L}$ is about 1.4 milliTorr. Corresponding target voltages are about 630V for $V_{T,S}$ and 530V for $V_{T,L}$. The lower minimum pressure for the small magnetron reflects the fact that its plasma loop is smaller and hence there is less electron loss around the loop. The generally smaller target voltages for the large magnetron reflect the fact the Paschen curves are determined for a set target power and the larger magnetron spreads a given power over a larger area and hence the same power produces a smaller voltage.

Assuming that the small magnetron sputtering is performed first, the chamber pressure may be brought to a pressure between the minimum pressures $P_{MIN,S}$ and $P_{MIN,L}$ of the two magnetrons with zero target power. The target power is then increased to a set value associated with the curves 80, 82. The voltage quickly rises to a value sufficiently above the small magnetron characteristic curve 80 that a plasma is excited adjacent the small magnetron, after which the target voltage quickly reduces to an operational point 84 on the small magnetron curve 80. However, no plasma is excited or even substantially maintained adjacent the large magnetron 60 because as shown for the large magnetron curve 82 the pressure is insufficient. At the operational point 84, the small magnetron 58 of FIG. 2 sputters the edge of the target 28. At the beginning of the cleaning phase, the chamber pressure is increased to above the minimum pressure $P_{MIN,L}$ for the large magnetron, preferably with the plasma left excited, that is, the target power is maintained. The operational point slides down the small magnetron curve 80 until the pressure is somewhat above $P_{MIN,L}$, above which the large magnetron can support a plasma. Typically no distinct plasma ignition is required since the plasma from the small magnetron diffuses to the large magnetron and quickly grows there. At the final pressure above $P_{MIN,L}$, the voltage needed to maintain a plasma adjacent the large magnetron is much less than that for the small magnetron. As a result, the target voltage quickly drops to an operational point 86 on or near the large magnetron curve 82. It is possible though as yet unverified that the plasma is maintained adjacent the small magnetron but at significantly reduced power. If the transition is performed from high pressure to low pressure, the plasma on the large magnetron extinguishes below $P_{MIN,L}$ and the target power is concentrated at the small magnetron. It is possible to change both pressure and target power between the two operational points with the understanding that different characteristics curves are obtained at different target powers. It is also possible to extinguish the plasma before changing pressure and reigniting it after the pressure has equilibrated at the new pressure.

Figure 4:
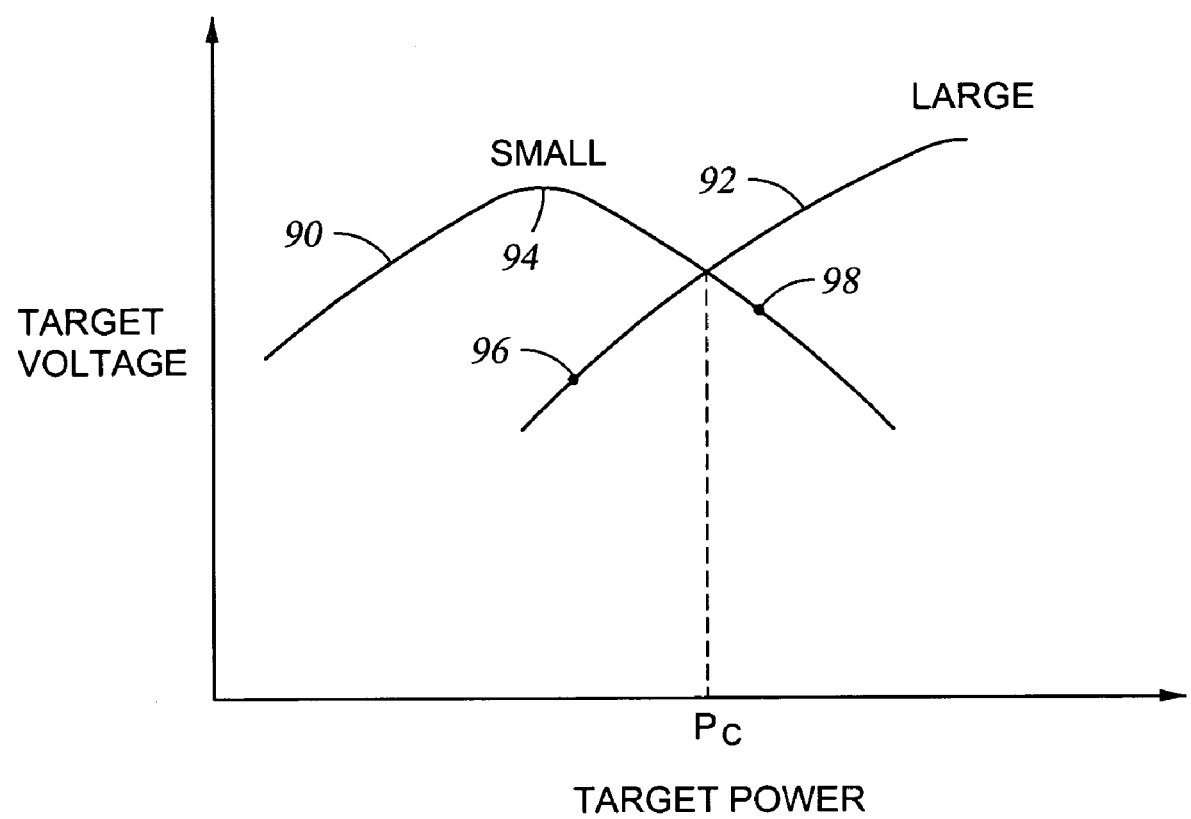
FIG. 4 is a graph of plasma states of two different magnetron which may be switched according to another embodiment of the invention by a change in target power.

The switching between magnetrons may alternatively be effected solely by changing the power supplied to the target. The graph of FIG. 4 illustrates characteristic curves 90, 92 which plot the target voltage as a function of target power for a small magnetron and a large magnetron respectively. Referring first to the characteristic curve 90 for the small magnetron, the target voltage increases with target power until a peak 94 is reached. At powers above the peak 94, the target voltage thereafter falls because decreasing plasma impedance due to the increasing fraction of ionized sputtered atoms, which can be attracted back to the target. At some unillustrated larger power, the target voltage again begins to increase. The characteristic curve 92 for the large magnetron falls generally below that for the small magnetron because the power is spread over a larger plasma area. Similarly to the small magnetron, the target voltage for the large magnetron increases with increasing target power but does not reach its peak within the illustrated power range. However, the two curves 90, 92 cross at a cross-over power $P_C$. Assuming that the chamber pressure is sufficient for a plasma and that a plasma has been ignited, if the overall target power for the dual magnetrons is set below $P_C$, an operational point 96 is achieved at which the power and resultant plasma are concentrated adjacent the large magnetron because of its smaller voltage at that power. However, if the overall target power is set above $P_C$, again assuming the chamber pressure is sufficient and a plasma is ignited, an operational point 98 is achieved at which the power and resultant plasma are concentrated adjacent the small magnetron because of its smaller voltage at that power. The plasma may remain struck during the power transition in either direction and the plasma diffuses from one magnetron to the other at the cross-over power $P_C$. It is of course possible to vary both pressure and power between the two operational points.

There are other operational parameters that may be changed to switch between the two magnetrons, for example, power applied to an RF coil intermediate the target and pedestal which can assist the ignition of a plasma adjacent the large magnetron. Changing the composition of the sputter working gas may also be used, for example, partially substituting helium or neon for argon.

An advantage of either pressure or power switching is that the transition can be made very quickly, generally the time needed to approximately reach the new pressure or power. As a result, it is feasible to clean for every wafer. In this case, very little redeposited material, especially nitride, needs to be removed. Therefore, the cleaning may be performed with the production wafer in the chamber. Further, the cleaning and the deposition may be performed in either order for a particular wafer within the chamber. However, cleaning may be performed only infrequently though for a longer time, for example, after 1000 wafer cycles.

In some applications, the cleaning step may be considered as a second deposition step with a significantly different magnetron than the magnetron used in the primary deposition step. While the small magnetron is designed to produce a high fraction of ionized sputtered atoms, which can be coated deep inside high aspect-ratio holes, the large magnetron may produce a more neutral flux, which can advantageously be deposited in a nearly isotropic sputter flux as a planar layer, for example, a flash or thicker layer preferentially deposited on the planar surface. For such dual step deposition, the two magnetrons may occupy the same radial band or may occupy different bands.

Although the description above has contrasted the different sizes of the two magnetrons, the invention is not so limited. For the bimodal operation, the magnetrons should have distinctly different magnetic field strengths or distribution which have different characteristics at supporting a plasma of the argon sputter working gas within the sputter reactor. The difference between the two magnetrons need not include a difference in size although differing size is a prime indicator of different distributions of magnetic field.

In some applications, it is required to clean the periphery of the target outside the central area being sputtered. The dual magnetrons of the invention can be adapted for this situation. When the two magnetrons are being used to produce different types of sputtering, it is possible that both magnetrons be located at or near the same target radius.

Although the invention is not limited to target composition, the redeposition problem necessitating target cleaning is worst for refractory nitride barriers such as Ti/TiN and Ta/TaN but is significant also for Al and for refractory metals such as Ni, Co, and Mo used for siliciding contacts. Further, the invention may be applied to yet other sputter materials.

The invention thus provides target cleaning without the need for mechanically moving the magnetron. The invention thus allows easy cleaning of planar targets preferred in commercial production. The invention also allows different types of sputtering within the same plasma sputter reactor.

The invention claimed is:

1. A plasma sputter reactor having a planar target arranged around a central axis, forming a side of a vacuum chamber, and facing along said central a pedestal disposed in said vacuum chamber for supporting a substrate to be processed, and a magnetron assembly comprising:
   a member rotating about said central axis on a side of said target opposite pedestal; and
   first and second magnetrons disjunct from each other and mounted on said member adjacent said planar target and scanning,
      wherein the first magnetron (1) has an first inner pole facing the target and of a first magnetic polarity along the central axis and a second outer pole facing the target, surrounding the first inner pole, separated from the first inner pole by a first annular gap, and of a second magnetic polarity opposed to the first magnetic polarity and (2) produces a first magnetic field distribution about the first magnetron and
      wherein the second magnetron (3) has a second inner pole facing the target and of a third magnetic polarity along the central axis and a second outer pole surrounding the second inner pole, which is facing the target, is separated from the second outer pole by a second annular gap, and of a fourth magnetic polarity opposed to the third magnetic polarity and (4) produces a second magnetic field distribution about the second magnetron which is substantially different from the first magnetic field distribution;
   wherein, at a first combination of sputter operating conditions including a non-zero level of DC power applied to the target and a pressure of a sputter working gas within said chamber, a first plasma of said working gas is more highly concentrated adjacent to said first magnetron than adjacent to said second magnetron; and
   wherein, at a second combination of sputter operating conditions different from the first combination and including a non-zero level of DC power applied to the target, a second plasma of said working gas is more highly concentrated adjacent to said second magnetron than adjacent to said first magnetron.

2. The magnetron assembly of claim 1,
   wherein, at a flint pressure of a sputter working gas within said chamber, the first plasma is more highly concentrated adjacent to said first magnetron than adjacent to the second magnetron; and
   wherein, at a second pressure of said sputter working gas within said chamber, the second plasma is more highly concentrated adjacent to said second magnetron than adjacent to the first magnetron.

3. The magnetron assembly of claim 2,
   wherein, at said first pressure of said sputter working gas within said chamber, only said first magnetron supports said first plasma of said sputter working gas within said chamber, and
   wherein, at a second pressure of said sputter working gas within said chamber, said second magnetron supports said second plasma of said sputter working gas within said chamber.

4. The magnetron assembly of claim 1,
   wherein, at a non-zero first level of DC power applied to said target, a first plasma of a sputter working gas within said chamber is more highly concentrated adjacent to said first magnetron than adjacent to the second magnetron; and
   wherein, at a non-zero second level of DC power applied to said target, a second plasma of said sputter working gas within said chamber is more highly concentrated adjacent to said second magnetron than adjacent to said first magnetron.

5. The magnetron assembly of claim 1, wherein said annular gap of said first magnetron is disposed completely away from and does not enclose said central axis and said annular gap of said second magnetron overlies said central axis.

6. The magnetron assembly of claim 1, wherein both of said annular gaps extend radially outward to a substantially same periphery of said target.

7. The magnetron assembly of claim 1, wherein said outer pole of said first magnetron includes has a total magnetic intensity at least twice that of said inner pole of said first magnetron.

8. A magnetron sputter reactor, comprising:
   a vacuum chamber arranged about a central axis;
   a pedestal aligned to said central axis for supporting a substrate to be processed;
   a planar target fittable to said chamber to face said pedestal along said central axis comprising a material to be sputter deposited on said substrate;
   a member rotating about said central axis in back of said target opposite said pedestal;
   a first magnetron mounted on said member, comprising a first inner pole facing the target of a first magnetic polarity along the central axis and a first outer pole facing the target of a second magnetic polarity opposed to the first magnetic polarity, and producing about itself a first magnetic field distribution; and
   a second magnetron disjunct from said first magnetron, mounted on said member, comprising a second inner pole facing the target and of a third magnetic polarity along the central axis and an second outer pole facing the target and of a fourth magnetic opposed to the third magnetic polarity, and producing about itself a second magnetic field distribution substantially different from said first magnetic field distribution;

wherein, at a first combination of a pressure of a sputter working gas in said chamber and a finite level of DC power applied to said target, a plasma of said sputter working gas is more highly concentrated adjacent said first magnetron relative to said second magnetron, and wherein, at a second combination of said pressure and said finite level of DC power, a plasma of said sputter working gas is more highly concentrated adjacent said second magnetron relative to said first magnetron.

9. A magnetron sputter reactor, comprising:

a vacuum chamber arranged about a central axis;

a pedestal aligned to said central axis for supporting a substrate to be processed;

a planar target fittable to said chamber to face said pedestal along said central axis comprising a material to be sputter deposited on said substrate;

a member rotating about said central axis in back of said target opposite said pedestal;

a first magnetron mounted on said member and including an outer first magnetic pole facing the target, of a first magnetic polarity and surrounding an inner second magnetic pole facing the target and of a second magnetic polarity opposite said first magnetic polarity and separated from said first magnetic pole by a first annular gap, and producing about itself a first magnetic field distribution, wherein the first magnetron scans an annular band of said target annular about said central axis; and a second magnetron disjunct from said first magnetron, mounted on said member, including an outer third magnetic pole facing the target, of said first magnetic polarity, and surrounding an inner fourth magnetic pole facing the target, of said second magnetic polarity, and separated from said third magnetic pole by a second annular gap, and producing about itself a second magnetic field distribution substantially different from said first magnetic field distribution, wherein the second magnetron scans a region of said target inside of said annular band, wherein said central axis passes through said second annular gap.

10. The reactor of claim 9, wherein said annular band and said region each includes a common band annular about said central axis.

11. The magnetron assembly of claim 1, wherein one of said magnetrons is substantially larger than another of said magnetrons.

12. The reactor of claim 8, wherein at the first combination only said first magnetron supports a plasma of said sputter working gas in the vacuum chamber.

13. The magnetron assembly of claim 1, wherein the annular gaps have respectively constant widths along their respective annular lengths.

14. The magnetron sputter reactor of claim 8, wherein a first gap separates the first inner and outer poles and a second gap separates the second inner and outer poles, wherein the first and second gaps having constant respective widths along their respective annular lengths.

15. The magnetron sputter reactor of claim 9, wherein the first annular gap has a first constant width along its annular length and the second annular gap has a second constant width along its annular length.

16. The magnetron assembly of claim 1:

wherein the first magnetic polarity of the flint inner pole is formed by a flint magnetic pole of a first type and facing the target;

wherein the second magnetic polarity of the first outer pole is formed by a second magnetic pole of a second type of pole opposed to the first type and facing the target;

wherein the third magnetic polarity of the second inner pole is formed by a third magnetic pole of a first one of the first and second types; and wherein the fourth magnetic polarity of the second outer pole is formed by a fourth magnetic pole of a second one of the first and second types.

* * * * *